(12) United States Patent  
Eid et al.

(10) Patent No.: US 11,658,418 B2  
(45) Date of Patent: *May 23, 2023

(54) MICROELECTRONIC DEVICES DESIGNED WITH MOLD PATTERNING TO CREATE PACKAGE-LEVEL COMPONENTS FOR HIGH FREQUENCY COMMUNICATION SYSTEMS

(71) Applicant: Intel Corporation, Santa Clara, CA (US)

(72) Inventors: Feras Eid, Chandler, AZ (US); Sasha N. Oster, Marion, IA (US); Telesphor Kamgaing, Chandler, AZ (US); Georgios C. Dogiamis, Chandler, AZ (US); Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 35 days.

This patent is subject to a terminal disclaimer.

(21) Appl. No.: 17/317,332

(22) Filed: May 11, 2021

(65) Prior Publication Data

US 2021/0265732 A1  Aug. 26, 2021

Related U.S. Application Data

(63) Continuation of application No. 16/345,171, filed as application No. PCT/US2016/066717 on Dec. 14, 2016, now Pat. No. 11,050,155.

(51) Int. Cl.
*H01Q 1/24* (2006.01)
*H01Q 1/38* (2006.01)
(Continued)

(52) U.S. Cl.
CPC ......... *H01Q 9/0414* (2013.01); *H01L 21/565* (2013.01); *H01L 23/3107* (2013.01);
(Continued)

(58) Field of Classification Search
CPC ............ H01Q 1/526; H01Q 1/52; H01Q 1/38; H01Q 21/00; H01Q 21/22; H01Q 9/04;
(Continued)

(56) References Cited

U.S. PATENT DOCUMENTS 6,597,318 B1   7/2003 Parsche
6,982,672 B2   1/2006 Lin
(Continued)

FOREIGN PATENT DOCUMENTS

JP   5988004       9/2016
KR   10-1208241    12/2012

OTHER PUBLICATIONS

International Search Report and Written Opinion for International Patent Application No. PCT/US2016/066717 dated Aug. 30, 2017, 14 pgs.

(Continued)

*Primary Examiner* — Tho G Phan
(74) *Attorney, Agent, or Firm* — Schwabe, Williamson & Wyatt, P.C.

(57) ABSTRACT

Embodiments of the invention include a microelectronic device that includes a first substrate having radio frequency (RF) components and a second substrate that is coupled to the first substrate. The second substrate includes a first conductive layer of an antenna unit for transmitting and receiving communications at a frequency of approximately 4 GHz or higher. A mold material is disposed on the first and second substrates. The mold material includes a first region that is positioned between the first conductive layer and a second conductive layer of the antenna unit with the mold
(Continued)

material being a dielectric material to capacitively couple the first and second conductive layers of the antenna unit.

20 Claims, 9 Drawing Sheets

(51) Int. Cl.
| | |
|---|---|
| *H01Q 9/04* | (2006.01) |
| *H01L 21/56* | (2006.01) |
| *H01L 23/31* | (2006.01) |
| *H01L 23/495* | (2006.01) |
| *H01L 23/552* | (2006.01) |
| *H01L 23/66* | (2006.01) |
| *H01Q 1/22* | (2006.01) |
| *H01Q 1/52* | (2006.01) |
| *H01Q 19/22* | (2006.01) |
| *H01L 23/367* | (2006.01) |

(52) U.S. Cl.
CPC ...... *H01L 23/49541* (2013.01); *H01L 23/552* (2013.01); *H01L 23/66* (2013.01); *H01Q 1/2283* (2013.01); *H01Q 1/241* (2013.01); *H01Q 1/526* (2013.01); *H01Q 19/22* (2013.01); *H01L 23/3675* (2013.01); *H01L 2223/6672* (2013.01); *H01L 2223/6677* (2013.01)

(58) Field of Classification Search
CPC ........ H01Q 9/0414; H01Q 19/22; H01Q 1/22; H01Q 1/2283; H01Q 1/24; H01Q 1/241; H01L 21/56; H01L 21/565; H01L 2223/6677; H01L 2224/16227; H01L 2224/73253; H01L 23/3107; H01L 23/3128; H01L 23/3675; H01L 23/49541; H01L 23/49822; H01L 23/49833; H01L 23/5225; H01L 23/552; H01L 23/66; H01L 2924/15192; H01L 2924/15311; H01L 2924/1815; H01L 2924/18161; H01L 2924/3025; H01L 2223/6672
See application file for complete search history.

(56) References Cited

U.S. PATENT DOCUMENTS

| | | | |
|---|---|---|---|
| 9,331,029 B2 | 5/2016 | Vincent | |
| 9,362,234 B2* | 6/2016 | Pabst | ............... H01L 23/552 |
| 10,410,983 B2 | 9/2019 | Kamgaing | |
| 10,546,835 B2* | 1/2020 | Nair | ............... H01L 23/5383 |
| 10,580,761 B2* | 3/2020 | Cheah | ............... H01Q 21/061 |
| 10,629,551 B2 | 4/2020 | Dogiamis | |
| 11,050,155 B2* | 6/2021 | Eid | ............... H01L 23/3128 |
| 11,387,200 B2* | 7/2022 | Dogiamis | ............... H01L 25/18 |
| 2015/0280327 A1 | 10/2015 | Spella | |
| 2016/0240493 A1 | 8/2016 | Lee et al. | |
| 2016/0240495 A1 | 8/2016 | Lachner et al. | |
| 2019/0288382 A1* | 9/2019 | Kamgaing | ............... H01Q 21/22 |

OTHER PUBLICATIONS

International Preliminary Report on Patentability for International Patent Application No. PCT/US2016/066717 dated Jun. 27, 2019, 11 pgs.

* cited by examiner

MICROELECTRONIC DEVICES DESIGNED WITH MOLD PATTERNING TO CREATE PACKAGE-LEVEL COMPONENTS FOR HIGH FREQUENCY COMMUNICATION SYSTEMS

CROSS-REFERENCE TO RELATED APPLICATION

This patent application is a continuation of U.S. patent application Ser. No. 16/345,171, filed Apr. 25, 2019, which is a U.S. National Phase Application under 35 U.S.C. § 371 of International Application No. PCT/US2016/066717, filed Dec. 14, 2016, entitled "MICROELECTRONIC DEVICES DESIGNED WITH MOLD PATTERNING TO CREATE PACKAGE-LEVEL COMPONENTS FOR HIGH FREQUENCY COMMUNICATION SYSTEMS," which designates the United States of America, the entire disclosure of which are hereby incorporated by reference in their entirety and for all purposes.

FIELD OF THE INVENTION

Embodiments of the present invention relate generally to the manufacture of semiconductor devices. In particular, embodiments of the present invention relate to microelectronic devices that are designed with mold patterning to create package-level components for high frequency communication systems.

BACKGROUND OF THE INVENTION

Future wireless products are targeting operation frequencies much higher than the lower GHz range utilized presently. For instance 5G (5th generation mobile networks or 5th generation wireless systems) communications are expected to operate at a frequency greater than or equal to 15 GHz. Moreover, the current WiGig (Wireless Gigabit Alliance) products operate around 60 GHz (e.g. 57-66 GHz worldwide). Other applications including automotive radar and medical imaging utilize wireless communication technologies in the millimeter wave frequencies (e.g., 24 GHz-300 GHz).

WiGig systems and the next generation of mobile and wireless communication standards (5G) require phased array antennas to compensate for both free space path losses and the small aperture of single antennas at millimeter wave (~24 GHz-300 GHz) frequencies. At those frequencies, the co-location of the antenna and the substrate on the same package is also critical to reduce the substrate path losses between the radio die and the radiating elements. Traditionally, stacked patch antennas on multilayer package substrates have been used at those frequencies for bandwidth enhancement. The key drawback however is that the die and the antenna have to be integrated vertically either through a single package (with step or cavity) or by stacking multiple packages. Fully embedded dies such as power amplifiers also generate substantial thermal dissipation, which makes it difficult for the power amplifiers to be embedded inside the substrate.

DETAILED DESCRIPTION OF THE INVENTION

Figure 1:
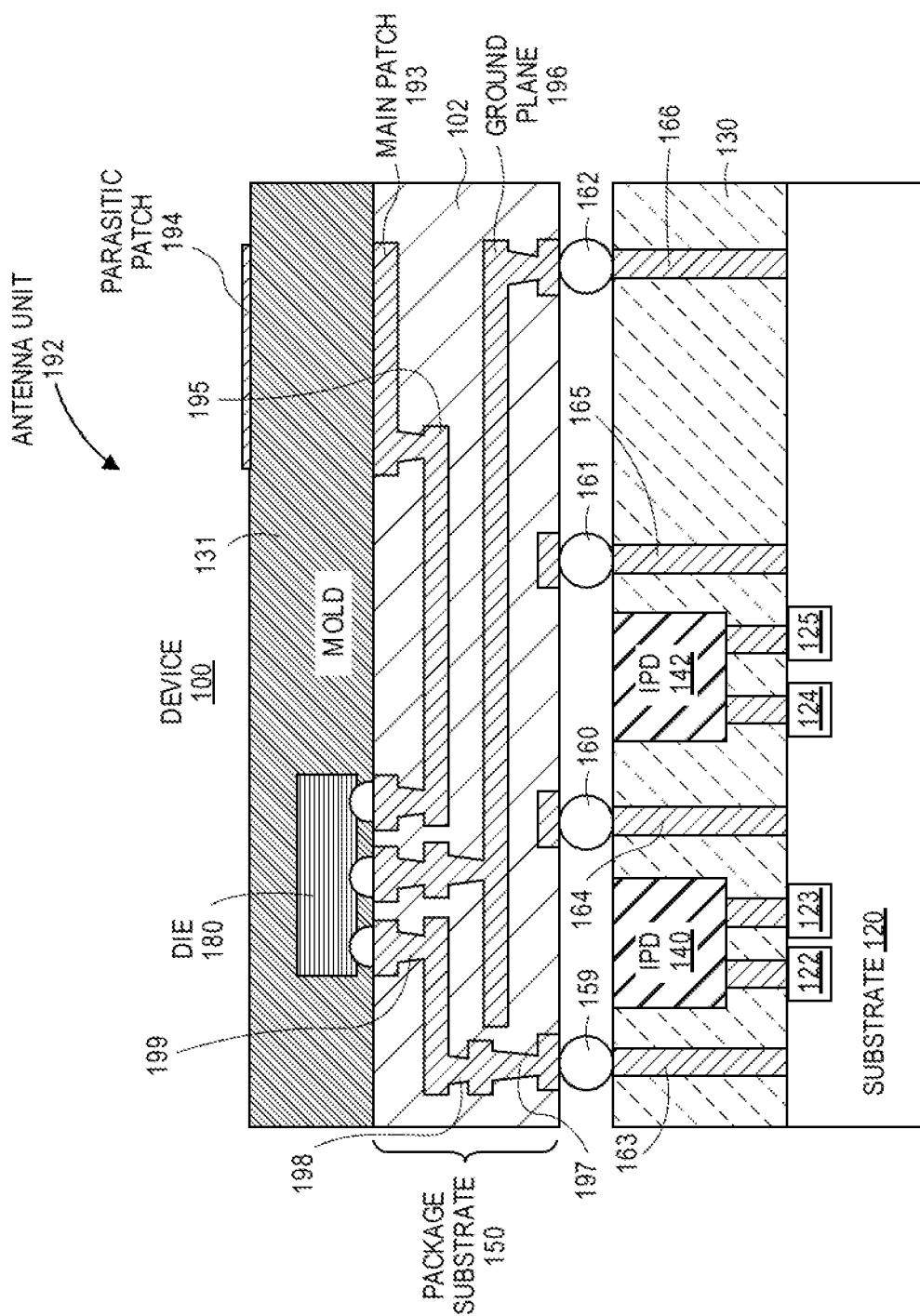
FIG. 1 illustrates a microelectronic device having a stacked patch antenna in accordance with one embodiment.

Described herein are microelectronic devices that are designed with mold patterning to create package-level components for high frequency communication systems. In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order to not obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

For high frequency (e.g., 5G, WiGig) wireless applications of millimeter (e.g., 1-10 mm, any mm wave or higher) wave communication systems, the present design utilizes a new packaging architecture that allows the integration of coupled antennas on molded packages and allows a wide tuning bandwidth. In addition, step mold is enabled, for example to expose the back side of the die for thermal cooling while providing a substantial thick area to the wide bandwidth antenna implementation.

The present design integrates stacked patch antennas into the package and couples the antennas capacitively by using a mold compound that is a dielectric material. Additionally, the present design can integrate monopole, dipole, and side radiating antenna elements among other types of antennas. This is enabled by the ability to deposit conductors on the mold and pattern the mold itself if necessary. The present design utilizes mold materials (e.g., filled epoxy materials, silicones, etc.) that are lower cost than package substrate materials (e.g., low temperature co-fired ceramic materials, liquid crystal polymers, etc.). The patterning of a mold compound for die shielding and antenna implementation can be achieved in the same process operations.

A step mold can be used to expose the backside of the die, therefore providing a path for effective thermal management. The mold compound enables an ultra-thin package in the area where the die is attached. This is important for small form factor (SFF) devices such as cell phones, PDAs, tablets, wearables, ultrabooks, etc.

The 5G architecture operates at a high frequency (e.g., at least 20 GHz, at least 25 GHz, at least 28 GHz, at least 30 GHz, etc.) and may also have approximately 1-50 gigabits per second (Gbps) connections to end points. In another example, the present design operates at lower frequencies (e.g., at least 4 GHz, approximately 4 GHz).

FIG. 1 illustrates a microelectronic device having a stacked patch antenna in accordance with one embodiment. The microelectronic device 100 includes an optional substrate 120 and a package substrate 150 having at least one antenna unit 192 with a main patch 193 and a parasitic patch 194. Alternatively, the at least one antenna unit 192 or an additional antenna unit can integrate monopole, dipole, and side radiating antenna elements among other types of antennas. The inter dielectric material between the main and parasitic patches is the mold material 131. The main patch or bottom antenna element 193 can be directly connected to the radio frequency die 180. The main patch is coupled capacitively to the parasitic patch (or top antenna element) through the mold material 131. A bandwidth improvement up to 2× can be achieved by tuning the physical dimensions of the parasitic patch 194. The package substrate 150 includes at least one antenna unit 192, conductive layers (e.g., 193-196), dielectric material 102 (e.g., organic material, low temperature co-fired ceramic materials, liquid crystal polymers, etc.), and different levels of conductive connections 197-199. The components 122-125 of the substrate 120 and IPDs (Integrated Passive Devices) 140 and 142 can communicate with components of the substrate 150 or other components not shown in FIG. 1 using connections 163-166 and solder balls 159-162. The IPDs may include any type of passives including inductors, transformers, capacitors, and resistors. In one example, capacitors on the IPD die may be used for power delivery. In another example, resistors on the same or a different IPD may be used for digital signal equalization. It is understood that a surface finish or cover layer may be used above the upper antenna element (e.g., parasitic patch 194) to prevent deterioration from environmental conditions, e.g., corrosion. In another example, the substrate 120 is a printed circuit board.

The main patch can be created during substrate manufacturing as part of the build up layers of the substrate 150. The parasitic patch can be deposited after molding using additive manufacturing (e.g., printing of metal inks or pastes on top of the mold through a screen or stencil with the desired pattern) or subtractive manufacturing (e.g., deposition of the metal using sputtering, electroless deposition, or other deposition techniques on top of a resist layer on the mold, and using liftoff to remove the resist and keep the metal in the desired areas only).

Figure 2:
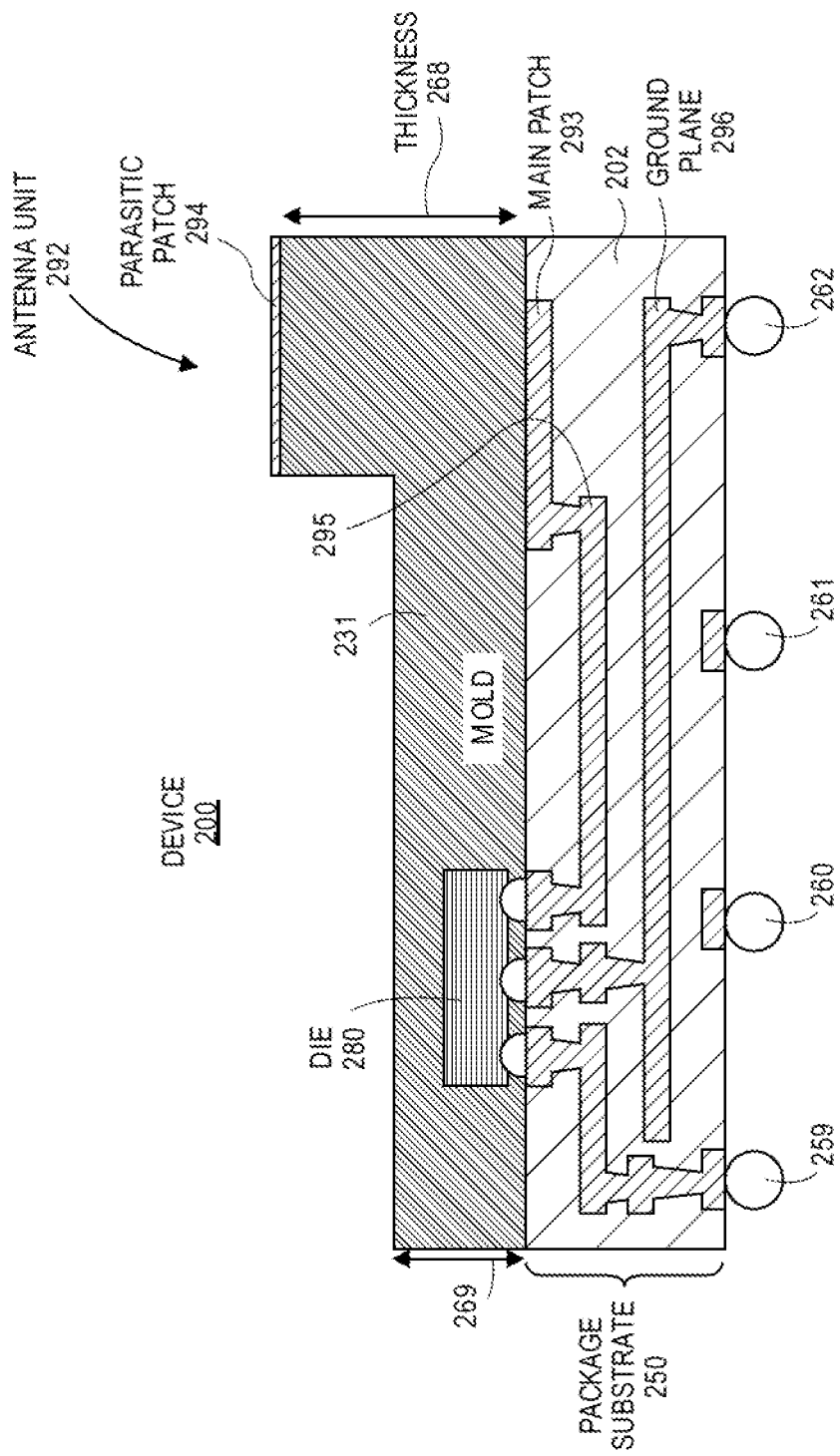
FIG. 2 illustrates a microelectronic device having a stacked patch antenna and a mold pattern with different thicknesses in accordance with one embodiment.

The mold can also be patterned to have regions of different thickness as shown in FIGS. 2 and 3. This can be used, for example, to reduce the mold thickness over the die while providing a substantially thick mold in the antenna region to enable wide bandwidth implementation. In some embodiments, the mold may be formed such that the backside of the die is exposed, as shown in FIG. 3.

FIG. 2 illustrates a microelectronic device having a stacked patch antenna and a mold pattern with different thicknesses in accordance with one embodiment. The microelectronic device 200 includes a package substrate 250 having at least one antenna unit 292 with a main patch 293 and a parasitic patch 294. Alternatively, the at least one antenna unit 292 or an additional antenna unit can integrate monopole, dipole, and side radiating antenna elements among other types of antennas. The inter dielectric material between the main and parasitic patches is the mold material 231. The mold material 231 has a thickness 269 (e.g., 50 to 150 microns) in a first region that is associated with and designed for a die 280 and a thickness 268 (e.g., 50 to 300 microns) in a second region that is associated with and designed for the antenna unit 292. The different thicknesses can be used, for example, to reduce the mold thickness over the die 280 while providing a substantially thick mold in the antenna region to enable wide bandwidth implementation. In one example, mold material in the second region has a thickness of 200 to 300 microns for frequencies near 30 GHz, a thickness of approximately 100 microns for frequencies near 60 GHz, and a thickness less than 100 microns for frequencies near 90 GHz. The main patch or bottom antenna element 293 can be directly connected to the radio frequency die 280. The main patch is coupled capacitively to the parasitic patch (or top antenna element) through the mold material 231. The package substrate 250 includes at least one antenna unit 292, conductive layers (e.g., 293-296), dielectric material 202 (e.g., organic material, low temperature co-fired ceramic materials, liquid crystal polymers, etc.), and different levels of conductive connections. In one example, the package substrate 250 has a thickness of 50 to 100 microns for ultra thin microelectronic devices. It is understood that a surface finish or cover layer may be used above the upper antenna element (e.g., parasitic patch 294) to prevent deterioration from environmental conditions, e.g., corrosion.

Figure 3A:
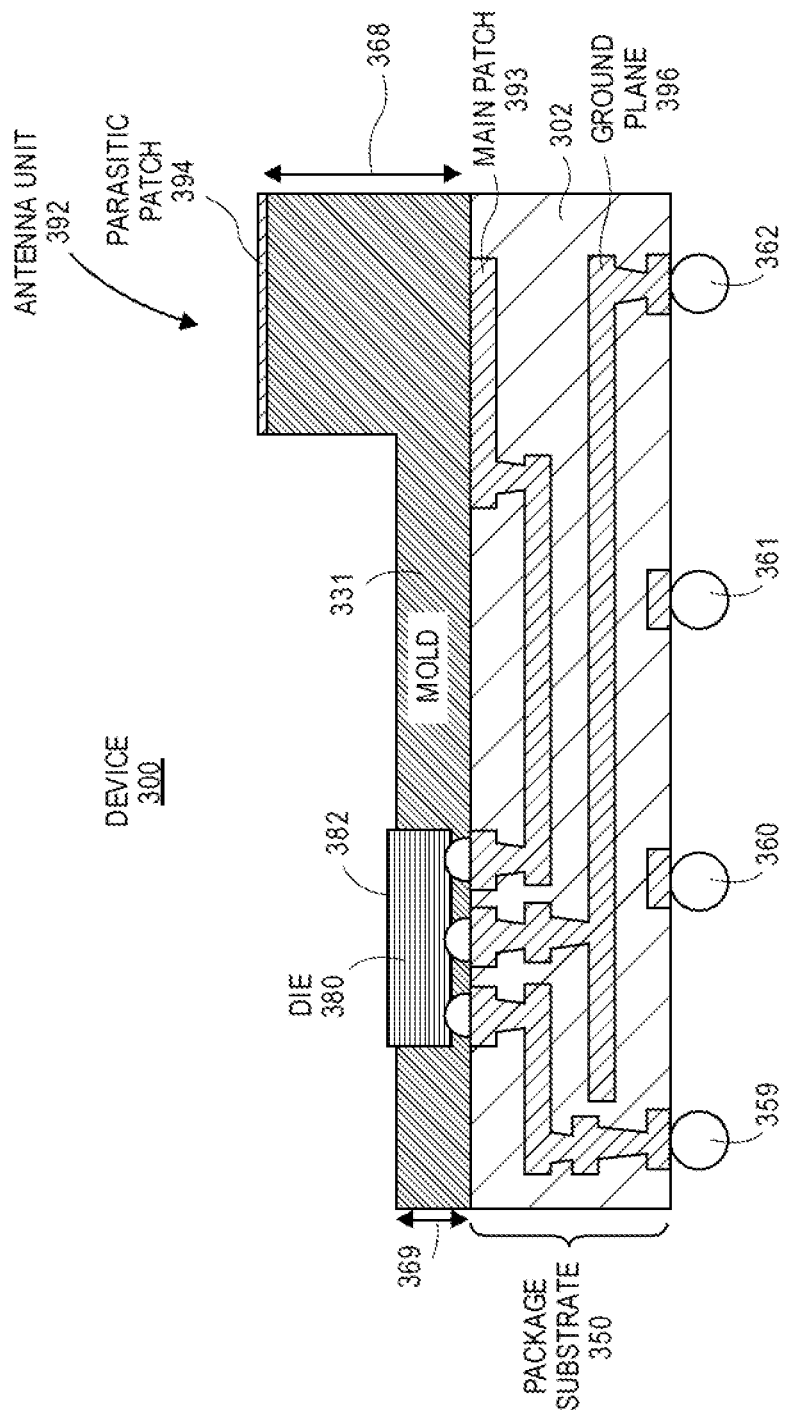
FIGS. 3A and 3B illustrate microelectronic devices having a stacked patch antenna and a mold pattern with different thicknesses in accordance with one embodiment.
Figure 3B:
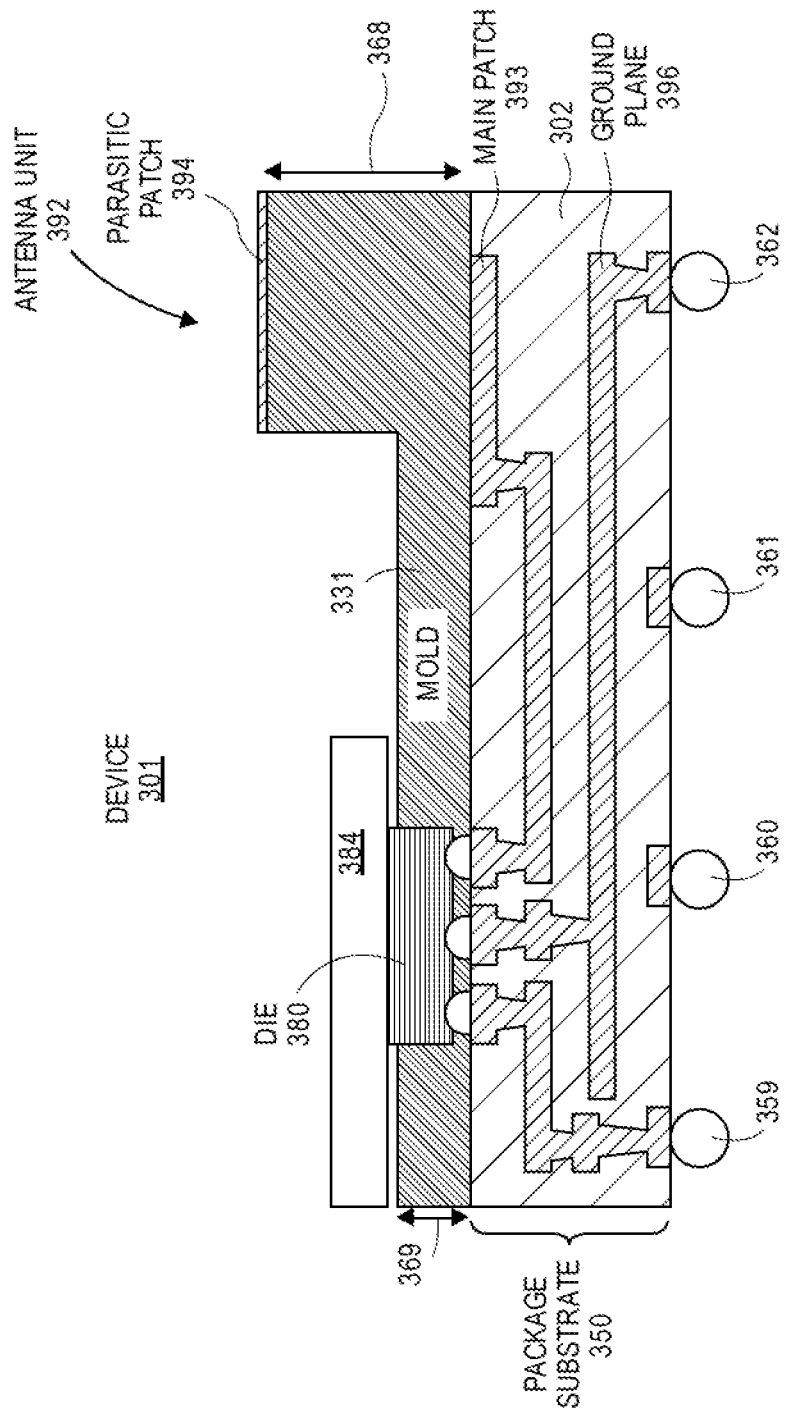

FIGS. 3A and 3B illustrate microelectronic devices having a stacked patch antenna and a mold pattern with different thicknesses in accordance with one embodiment. The microelectronic device 300 of FIG. 3A includes a package substrate 350 having an antenna unit 392 with a main patch 393 and a parasitic patch 394. Alternatively, the at least one antenna unit 392 or an additional antenna unit can integrate monopole, dipole, and side radiating antenna elements among other types of antennas. The inter dielectric material between the main and parasitic patches is the mold material 331. The mold material 331 has a thickness 369 (e.g., 50 to 100 microns) in a first region that is associated with and designed for a die 380 and a thickness 368 (e.g., 50 to 300 microns) in a second region that is associated with and designed for the antenna unit 392. The different thicknesses can be used, for example, to reduce the mold thickness over the die 380 such that an upper surface 382 of the die is exposed while providing a substantially thick mold in the antenna region to enable wide bandwidth implementation. A heat spreader or heat sink 384 can optionally be positioned in close proximity to the upper surface 382 of the die 380 as illustrated in the microelectronic device 301 of FIG. 3B. In one example, mold material in the antenna region has a thickness of 200 to 300 microns for frequencies near 30 GHz, a thickness of approximately 100 microns for frequencies near 60 GHz, and a thickness less than 100 microns for frequencies near 90 GHz. The main patch or bottom antenna element 393 can be directly connected to the radio frequency die 380. The main patch is coupled capacitively to the parasitic patch (or top antenna element) through the mold material 331. The package substrate 350 includes at least one antenna unit 392, conductive layers (e.g., 393, 394, 396), dielectric material 302 (e.g., organic material, low temperature co-fired ceramic materials, liquid crystal polymers, etc.), and different levels of conductive connections. In one example, the package substrate 350 has a thickness of 50 to 100 microns for ultra thin microelectronic devices. It is understood that a surface finish or cover layer may be used above the upper antenna element (e.g., parasitic patch 394) to prevent deterioration from environmental conditions, e.g., corrosion.

FIGS. 4, 5A, 5B, 6A, and 6B illustrate processes for mold patterning with different thickness of the mold (e.g., 2 different mold thicknesses, 3 different mold thicknesses, etc.).

Figure 4:
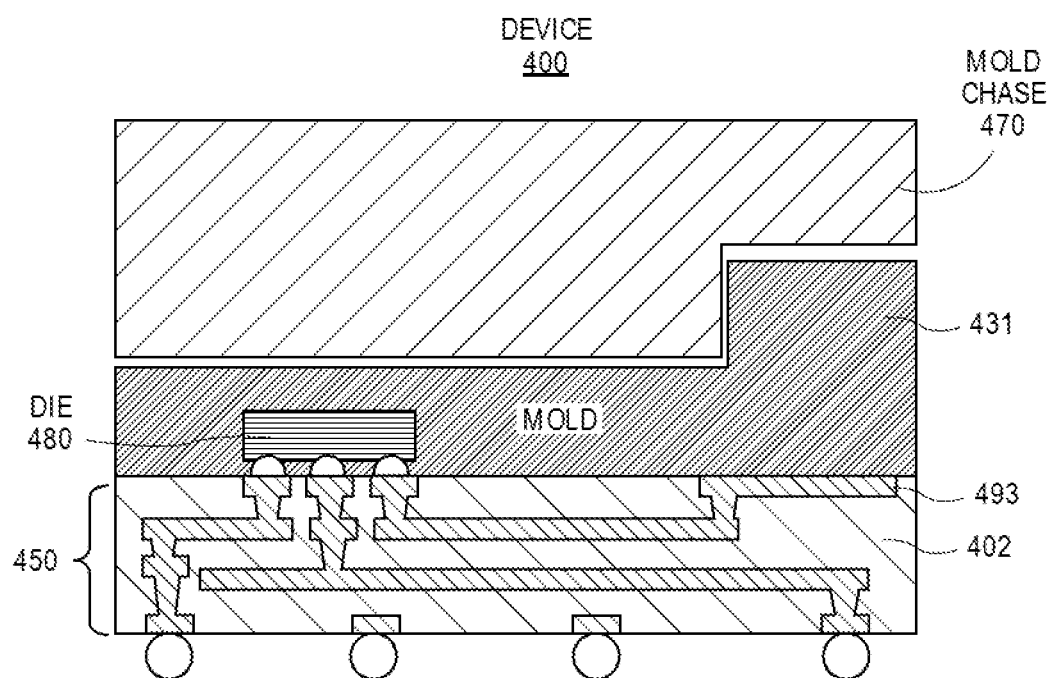
FIG. 4 illustrates a process with a mold chase for mold patterning in accordance with one embodiment.

FIG. 4 illustrates a process with a mold chase for mold patterning in accordance with one embodiment. A microelectronic device 400 includes a package substrate 450 having a main patch 493 of an antenna unit, conductive layers, dielectric material 402 (e.g., organic material, low temperature co-fired ceramic materials, liquid crystal polymers, etc.), and different levels of conductive connections. A mold chase 470 with a step or pedestal is applied during the molding operation to form the mold material 431 with different thicknesses in different regions. In this example, a first region that includes a die 480 has a thinner mold material and a second region that includes an antenna unit has a thicker mold material.

Figure 5A:
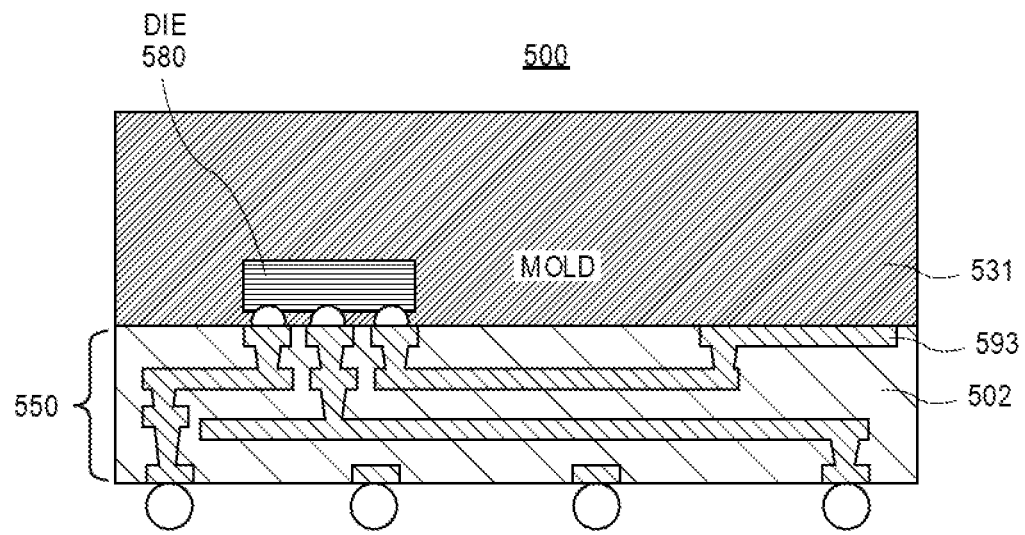
FIGS. 5A and 5B illustrate a process for mold patterning in accordance with one embodiment.
Figure 5B:
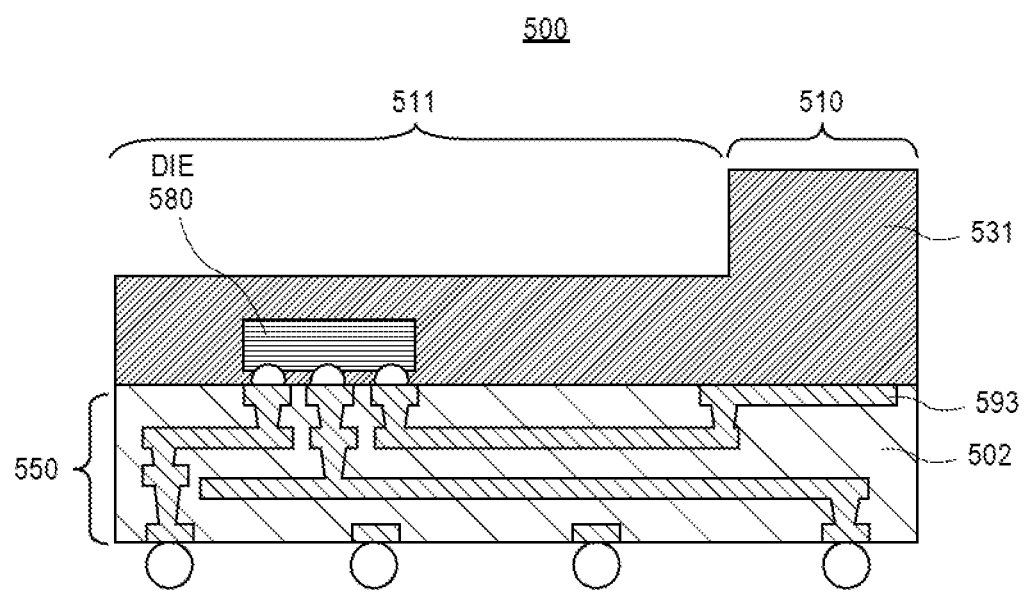

FIGS. 5A and 5B illustrate a process for mold patterning in accordance with one embodiment. A microelectronic device 500 includes a package substrate 550 having a main patch 593 of an antenna unit, conductive layers, dielectric material 502 (e.g., organic material, low temperature co-fired ceramic materials, liquid crystal polymers, etc.), and different levels of conductive connections. A mold material 531 with a first thickness (e.g., maximum desired thickness) is formed as illustrated in FIG. 5A. Then, the mold material is removed selectively from a region 511 during one or more operations to create regions with different thicknesses in the mold material. For example, the selective removal of the mold material can be performed by masking and etching, waterblasting, or laser ablation, etc. The laser ablation can be used to create features as small as 250 microns or even smaller. In this example, the region 511 that includes a die 580 has a thinner mold material and a second region 510 that includes an antenna unit has a thicker mold material.

Figure 6A:
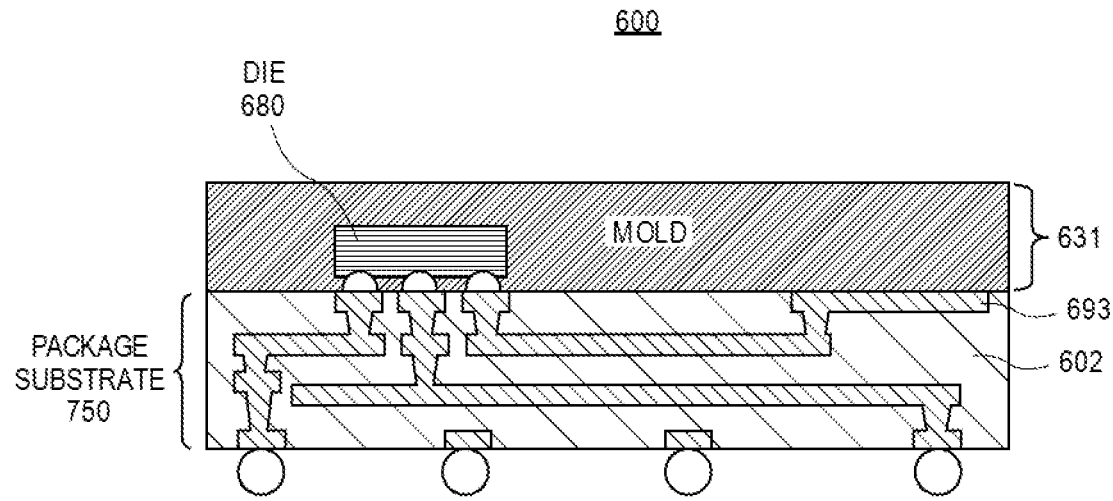
FIGS. 6A and 6B illustrate a process for mold patterning in accordance with one embodiment.
Figure 6B:
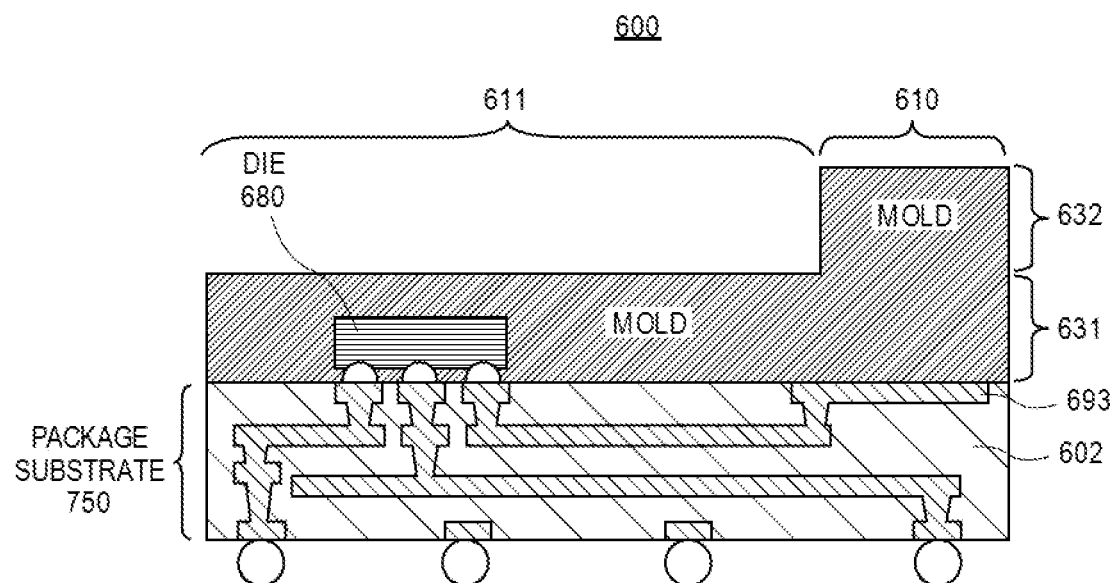

FIGS. 6A and 6B illustrate a process for mold patterning in accordance with one embodiment. A microelectronic device 600 includes a package substrate 650 having a main patch 693 of an antenna unit, conductive layers, dielectric material 602 (e.g., organic material, low temperature co-fired ceramic materials, liquid crystal polymers, etc.), and different levels of conductive connections. A mold material 631 with a first thickness is formed as illustrated in FIG. 6A with a first mold chase. Then, a second mold material 632 is selectively formed for a region 610 (e.g., antenna region) with a second mold chase. In this example, the region 611 that includes a die 680 has a thinner mold material and the region 610 that includes an antenna unit has a thicker mold material.

Deposition and patterning of a parasitic patch can then be performed after mold patterning for FIGS. 4, 5A, 5B, 6A, and 6B using the additive or subtractive manufacturing techniques discussed previously.

Figure 7:
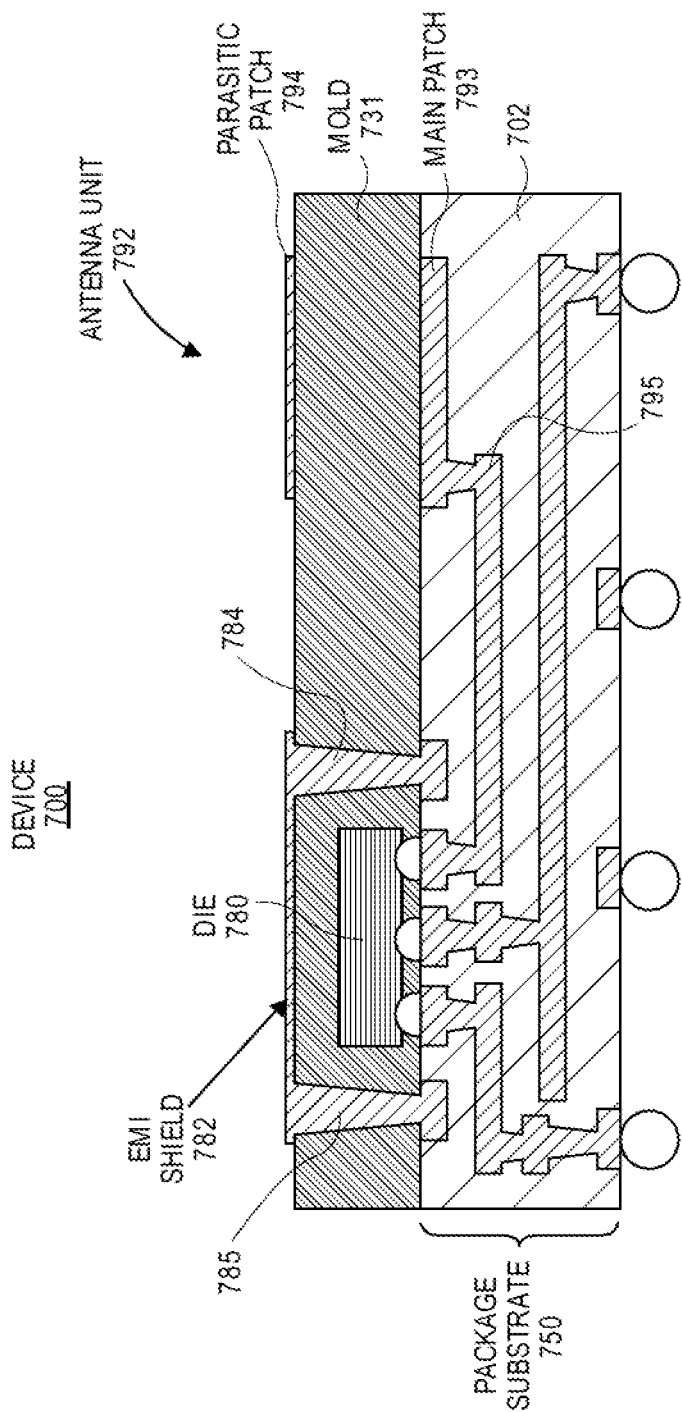
FIG. 7 illustrates a microelectronic device having a stacked patch antenna and an electromagnetic radiation interference (EMI) shield in accordance with one embodiment.

The above concepts can also be used to selectively shield one or more dies in the package substrate in addition to creating the stacked patch antennas. FIG. 7 illustrates a microelectronic device having a stacked patch antenna and an electromagnetic radiation interference (EMI) shield in accordance with one embodiment. The microelectronic device 700 includes a package substrate 750 having an antenna unit 792 with a main patch 793 and a parasitic patch 794. The inter dielectric material between the main and parasitic patches is the mold material 731. The main patch or bottom antenna element 793 can be directly connected to the radio frequency die 780. The main patch is coupled capacitively to the parasitic patch 794 (or top antenna element) through the mold material 731. The package substrate 750 includes at least one antenna unit 792, conductive layers (e.g., 793, 795), dielectric material 702 (e.g., organic material, low temperature co-fired ceramic materials, liquid crystal polymers, etc.), and different levels of conductive connections including through mold connections 784 and 785. In one example, the mold is patterned (e.g., using a custom mold chase or by selective removal, as described in conjunction with FIGS. 4, 5A, and 5B) to create via holes. Metal deposition and patterning techniques are then used to fill the holes and create the EMI shield 782 as well as the top antenna parasitic patch 794. These conductive connections 784 and 785 are used to ground the EMI shield 782 by connecting it to a ground plane in the substrate 750. This integrated shield is critical for EMI isolation especially for small "victim" components such as low noise amplifiers (LNAs) used in GPS modules or aggressor components such as power amplifiers. In multichip modules, the integrated shield can be used as a compartmental shield to isolate several components from each other. In some cases, the EMI shield may also serve as a local heat spreader for the dies. The EMI shield may also be located in close proximity to an upper surface of the die 780. An additional through mold conductive connection (or connections 784, 785) may couple the parasitic patch 794 to any other component in the device 700.

The package substrates and mold material can have different thicknesses, length, and width dimensions in comparison to those disclosed and illustrated herein. The mold material may be a low loss nonconductive dielectric material and the shielding may be made out of a conductive material.

In another embodiment, any of the devices or components can be coupled to each other.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 8:
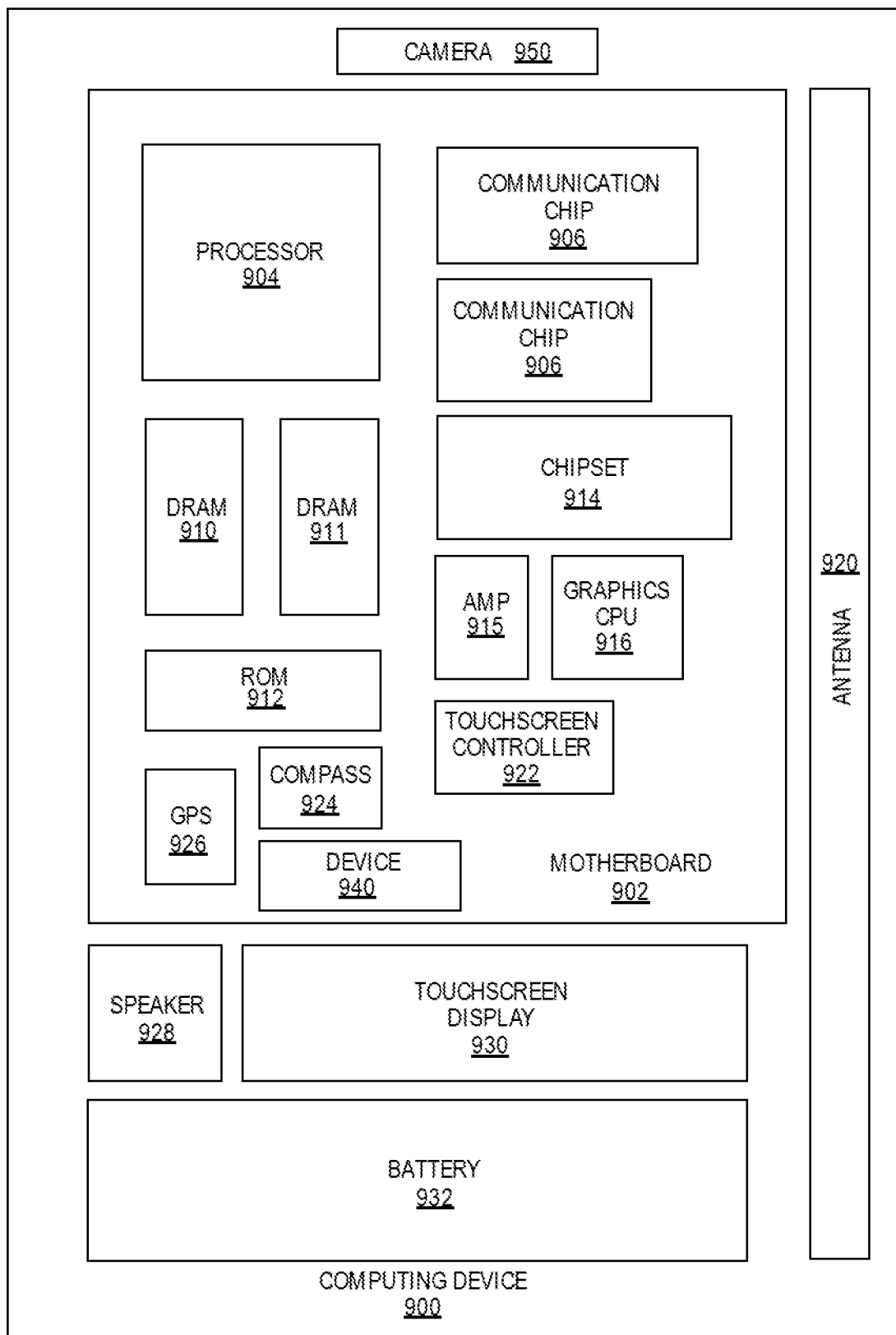
FIG. 8 illustrates a computing device 900 in accordance with one embodiment.

FIG. 8 illustrates a computing device 900 in accordance with one embodiment. The computing device 900 houses a board 902. The board (e.g., motherboard, printed circuit board, etc.) may include a number of components, including but not limited to at least one processor 904 and at least one communication chip 906. The at least one processor 904 is physically and electrically coupled to the board 902. In some implementations, the at least one communication chip 906 is also physically and electrically coupled to the board 902. In further implementations, the communication chip 906 is part of the processor 904. In one example, the communication chip 906 (e.g., microelectronic device 100, 200, 300, 400, 500, 600, 700, etc.) includes an antenna unit 920 (e.g., antenna unit 192, 292, 392, 792, etc.).

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna unit 920, a display, a touchscreen display 930, a touchscreen controller 922, a battery 932, an audio codec, a video codec, a power amplifier 915, a global positioning system (GPS) device 926, a compass 924, a gyroscope, a speaker, a camera 950, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi, WiGig, and Bluetooth and a second communication chip 906 may be dedicated to longer range wireless communications such as GPS, EDGE, GPRS, CDMA, WiMAX, LTE, Ev-DO, 5G, and others.

The at least one processor 904 of the computing device 900 includes an integrated circuit die packaged within the at least one processor 904. In some embodiments of the invention, the processor package includes one or more devices, such as microelectronic devices (e.g., microelectronic device 100, 200, 300, 400, 500, 600, 700, etc.) in accordance with implementations of embodiments of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the invention, the communication chip package includes one or more microelectronic devices (e.g., microelectronic device 100, 200, 300, 400, 500, 600, 700, etc.).

The following examples pertain to further embodiments. Example 1 is a microelectronic device that includes a first substrate having radio frequency (RF) components and a second substrate that is coupled to the first substrate. The second substrate includes a first conductive layer of an antenna unit for transmitting and receiving communications at a frequency of approximately 4 GHz or higher. A mold material is disposed on the first and second substrates. The mold material includes a first region that is positioned between the first conductive layer and a second conductive layer of the antenna unit with the mold material being a dielectric material to capacitively couple the first and second conductive layers of the antenna unit.

In example 2, the subject matter of example 1 can optionally include the mold material including a first thickness for the first region that is associated with the antenna unit and a second thickness for a second region that is associated with the first substrate.

In example 3, the subject matter of any of examples 1-2 can optionally include the first thickness being less than approximately 300 microns and the second thickness being less than approximately 150 microns.

In example 4, the subject matter of any of examples 1-3 can optionally include the second thickness for the second region that is associated with the first substrate being designed to expose an upper surface of the first substrate for enhanced thermal management of the first substrate.

In example 5, the subject matter of any of examples 1-4 can optionally include a through mold conductive connection that is coupled to the first conductive layer of the antenna unit. The first and second conductive layers of the antenna unit forming a stacked patch antenna that is integrated with the second substrate.

In example 6, the subject matter of any of examples 1-5 can optionally include the second substrate comprising an organic package substrate having conductive layers and organic dielectric layers.

In example 7, the subject matter of any of examples 1-6 can optionally include the microelectronic device further comprising an additional antenna unit with each antenna unit being connected to at least one RF component including at least one transceiver die to form a phased array antenna module of a 5G package architecture for 5G communications.

Example 8 is a microelectronic device comprising a first substrate having radio frequency (RF) components and a second substrate coupled to the first substrate. The second substrate includes conductive layers and organic dielectric layers. A mold material is disposed on the first and second substrates and an electromagnetic interference (EMI) shield is integrated with the mold material to shield the RF components from EMI.

In example 9, the subject matter of example 8 can optionally include the second substrate including a first conductive layer of an antenna unit for transmitting and receiving communications at a frequency of approximately 4 GHz or higher and the mold material including a first region that is positioned between the first conductive layer and a second conductive layer of the antenna unit with the mold material being a dielectric material to capacitively couple the first and second conductive layers of the antenna unit.

In example 10, the subject matter of any of examples 8-9 can optionally include the first substrate comprising a die and the mold material including a second region that is positioned between the EMI shield and an upper surface of the die.

In example 11, the subject matter of any of examples 8-10 can optionally include the first and second conductive layers of the antenna unit forming a stacked patch antenna that is integrated with the second substrate.

In example 12, the subject matter of any of examples 8-11 can optionally include the first substrate comprising a die and the EMI shield being positioned in close proximity to an upper surface of the die.

In example 13, the subject matter of any of examples 8-12 can optionally include through mold conductive connections for electrically coupling the EMI shield to a conductive ground layer within the second substrate.

In example 14, the subject matter of any of examples 8-13 can optionally include the microelectronic device comprising a 5G package architecture for 5G communications.

Example 15 is a computing device comprising at least one processor to process data and a communication module or chip coupled to the at least one processor. The communication module or chip comprises a first substrate having radio frequency (RF) components and a second substrate coupled to the first substrate. The second substrate includes a first conductive layer of an antenna unit for transmitting and receiving communications at a frequency of approximately 15 GHz or higher and a mold material disposed on the first and second substrates. The mold material includes a first region that is positioned between the first conductive layer and a second conductive layer of the antenna unit with the mold material being a dielectric material to capacitively couple the first and second conductive layers of the antenna unit.

In example 16, the subject matter of example 15 can optionally include the mold material including a first thickness for the first region that is associated with the antenna unit and a second thickness for a second region that is associated with the first substrate.

In example 17, the subject matter of any of examples 15-16 can optionally include the first thickness being less than approximately 300 microns and the second thickness being less than approximately 150 microns.

In example 18, the subject matter of any of examples 15-17 can optionally include the second thickness for the second region that is associated with the first substrate being designed to expose an upper surface of the first substrate for enhanced thermal management of the first substrate.

In example 19, the subject matter of any of examples 15-18 can optionally include the first and second conductive layers of the antenna unit forming a stacked patch antenna that is integrated with the second substrate.

In example 20, the subject matter of any of examples 15-19 can optionally include the second substrate comprising an organic package substrate having conductive layers and organic dielectric layers. The microelectronic device comprises a 5G package architecture for 5G communications.

What is claimed is:

1. A microelectronic device comprising:
    a first substrate having radio frequency (RF) components, the first substrate having an uppermost surface;
    a second substrate coupled to the first substrate, the second substrate including a first conductive layer of an antenna unit; and
    a mold material disposed on the first and second substrates, the mold material including a first region that is positioned between the first conductive layer and a second conductive layer of the antenna unit with the mold material being a dielectric material, and the mold material having an uppermost surface above the uppermost surface of the first substrate, wherein the second conductive layer of the antenna unit is on the uppermost surface of the mold material.

2. The microelectronic device of claim 1, wherein the mold material includes a first thickness for the first region that is associated with the antenna unit and a second thickness for a second region that is associated with the first substrate.

3. The microelectronic device of claim 2, wherein the first thickness is less than approximately 300 microns and the second thickness is less than approximately 150 microns.

4. The microelectronic device of claim 2, wherein the second thickness for the second region that is associated with the first substrate is designed to expose an upper surface of the first substrate for enhanced thermal management of the first substrate.

5. The microelectronic device of claim 1, further comprising:
    a through mold conductive connection that is coupled to the first conductive layer of the antenna unit, wherein the first and second conductive layers of the antenna unit form a stacked patch antenna that is integrated with the second substrate.

6. The microelectronic device of claim 5, wherein the second substrate comprises an organic package substrate having conductive layers and organic dielectric layers.

7. The microelectronic device of claim 1, wherein the microelectronic device further comprises an additional antenna unit with each antenna unit being connected to at least one RF component including at least one transceiver die to form a phased array antenna module of a 5G package architecture for 5G communications.

8. A microelectronic device comprising:
    a first substrate having radio frequency (RF) components, wherein the first substrate comprises a die having an upper surface;
    a second substrate coupled to the first substrate, the second substrate including conductive layers and organic dielectric layers, wherein the second substrate includes a first conductive layer of an antenna unit;
    a mold material disposed on the first and second substrates, wherein the mold material includes a first region that is positioned between the first conductive layer and a second conductive layer of the antenna unit with the mold material being a dielectric material; and
    an electromagnetic interference (EMI) shield integrated with the mold material to shield the RF components from EMI, wherein the EMI shield is positioned in close proximity to the upper surface of the die of the first substrate.

9. The microelectronic device of claim 8, wherein the first substrate comprises a die and the mold material includes a second region that is positioned between the EMI shield and an upper surface of the die.

10. The microelectronic device of claim 8, wherein the first and second conductive layers of the antenna unit form a stacked patch antenna that is integrated with the second substrate.

11. The microelectronic device of claim 8, further comprising:
    through mold conductive connections for electrically coupling the EMI shield to a conductive ground layer within the second substrate.

12. The microelectronic device of claim 8, wherein the microelectronic device comprises a 5G package architecture for 5G communications.

13. A computing device comprising:
    at least one processor to process data; and
    a communication module or chip coupled to the at least one processor, the communication module or chip comprises, a first substrate having radio frequency (RF) components, the first substrate having an uppermost surface, a second substrate coupled to the first substrate, the second substrate including a first conductive layer of an antenna unit; and a mold material disposed on the first and second substrates, the mold material including a first region that is positioned between the first conductive layer and a second conductive layer of the antenna unit with the mold material being a dielectric material, and the mold material having an uppermost surface above the uppermost surface of the first substrate, wherein the second conductive layer of the antenna unit is on the uppermost surface of the mold material.

14. The computing device of claim 13, wherein the mold material includes a first thickness for the first region that is associated with the antenna unit and a second thickness for a second region that is associated with the first substrate.

15. The computing device of claim 14, wherein the first thickness is less than approximately 300 microns and the second thickness is less than approximately 150 microns.

16. The computing device of claim 14, wherein the second thickness for the second region that is associated with the first substrate is designed to expose an upper surface of the first substrate for enhanced thermal management of the first substrate.

17. The computing device of claim 13, wherein the first and second conductive layers of the antenna unit form a stacked patch antenna that is integrated with the second substrate.

18. The computing device of claim 13, wherein the second substrate comprises an organic package substrate having conductive layers and organic dielectric layers, wherein the microelectronic device comprises a 5G package architecture for 5G communications.

19. A microelectronic device comprising:

a first substrate having radio frequency (RF) components;

a second substrate coupled to the first substrate, the second substrate including a first conductive layer of an antenna unit;

a mold material disposed on the first and second substrates, the mold material including a first region that is positioned between the first conductive layer and a second conductive layer of the antenna unit with the mold material being a dielectric material; and an additional antenna unit with each antenna unit being connected to at least one RF component including at least one transceiver die to form a phased array antenna module of a 5G package architecture for 5G communications.

20. The microelectronic device of claim 19, wherein the mold material includes a first thickness for the first region that is associated with the antenna unit and a second thickness for a second region that is associated with the first substrate.

* * * * *